US010209630B2

(12) United States Patent
Holzner et al.

(10) Patent No.: US 10,209,630 B2
(45) Date of Patent: Feb. 19, 2019

(54) SCANNING PROBE NANOLITHOGRAPHY SYSTEM AND METHOD

(71) Applicants: SwissLitho AG, Zürich (CH); International Business Machines Corporation, Armonk, NY (US)

(72) Inventors: Felix Holzner, Zürich (CH); Michael Zientek, Zürich (CH); Philip Paul, Adliswil (CH); Armin Knoll, Adliswil (CH); Colin Rawlings, Rüschlikon (CH)

(73) Assignee: SwissLitho AG, Zurich (CH)

( * ) Notice: Subject to any disclaimer, the term of this patent is extended or adjusted under 35 U.S.C. 154(b) by 4 days.

(21) Appl. No.: 15/022,545

(22) PCT Filed: Sep. 16, 2014

(86) PCT No.: PCT/EP2014/069667
§ 371 (c)(1),
(2) Date: Mar. 16, 2016

(87) PCT Pub. No.: WO2015/036605
PCT Pub. Date: Mar. 19, 2015

(65) Prior Publication Data
US 2016/0231656 A1 Aug. 11, 2016

(30) Foreign Application Priority Data
Sep. 16, 2013 (EP) ..................... 13184651

(51) Int. Cl.
G03F 7/20 (2006.01)
G03F 7/00 (2006.01)

(52) U.S. Cl.
CPC ........ *G03F 7/70775* (2013.01); *G03F 7/0002* (2013.01)

(58) Field of Classification Search
CPC .................. G01Q 40/00; G01Q 80/00; G05B 2219/37119; G03F 7/0002; G03F 7/70775
See application file for complete search history.

(56) References Cited

U.S. PATENT DOCUMENTS 4,889,988 A 12/1989 Elings et al.
5,327,625 A * 7/1994 Clark, Jr. ............. G05B 19/251
125/23.01

(Continued)

OTHER PUBLICATIONS

Search Report dated, Dec. 19, 2014.

*Primary Examiner* — David E Smith
(74) *Attorney, Agent, or Firm* — Johnson, Marcou & Isaacs, LLC; Jennifer S. Stachniak

(57) ABSTRACT

A scanning probe nanolithography system comprising a probe to create nanostructures line (60) by line through writing said nanostructures (74) pixel by pixel along lines (61) on a sample. A positioning system is adapted to provide a positioning of the probe at a sequence of predetermined positions to the sample and its surface towards the probe and a control unit (50) is provided to control the positioning system for positioning the probe for a pixel-wise writing of said lines (61) through a writing unit. It further comprises a sensor unit adapted to detect a predetermined property of the written nanostructure (74), the sensor unit being connected to the control unit to adapt the control signals to be provided to the writing unit for writing the following line (61; 62) based on the measured signals (65; 66) of the predetermined property.

16 Claims, 2 Drawing Sheets

(56) References Cited

U.S. PATENT DOCUMENTS

| | | | |
|---|---|---|---|
| 5,825,670 A | 10/1998 | Chernoff et al. | |
| 7,060,977 B1* | 6/2006 | Dupeyrat | B82Y 10/00 |
| | | | 250/306 |
| 8,261,622 B2 | 9/2012 | Koteskey | |
| 8,261,662 B1* | 9/2012 | Shile | G02B 21/002 |
| | | | 101/327 |
| 2003/0185967 A1 | 10/2003 | Eby et al. | |
| 2006/0033024 A1* | 2/2006 | Sparks | B82Y 35/00 |
| | | | 250/306 |
| 2006/0082379 A1* | 4/2006 | Liu | B82Y 10/00 |
| | | | 257/226 |
| 2007/0062264 A1* | 3/2007 | Wang | G01Q 70/06 |
| | | | 73/105 |
| 2008/0229812 A1* | 9/2008 | Hund | G01Q 30/20 |
| | | | 73/105 |
| 2011/0247108 A1* | 10/2011 | Park | B82Y 35/00 |
| | | | 850/21 |
| 2001/0268882 | 11/2011 | Bussan et al. | |
| 2011/0268882 A1* | 11/2011 | Bussan | B82Y 10/00 |
| | | | 427/256 |
| 2014/0304861 A1 | 10/2014 | Kim et al. | |

\* cited by examiner

SCANNING PROBE NANOLITHOGRAPHY SYSTEM AND METHOD

The instant application should be granted the priority dates of Sep. 16, 2013 the filing date of the corresponding European patent application EP 13 184 651.1, as well as Sep. 16, 2014, the filing date of the international patent application PCT/EP2014/069667.

BACKGROUND OF THE INVENTION

The present invention relates to a scanning probe nanolithography system and a control method of scanning probe nanolithography processes.

Scanning probe nanolithography systems are known from a plurality of prior art documents, e.g. U.S. Pat. No. 8,261,662, reciting further publications.

Nanolithography is usually done in an open-loop way, meaning that all writing/patterning parameters have to be set prior to the writing/patterning process. No information from the written nanostructure is obtained during the writing process. Therefore, all external (temperature, humidity, pressure, . . . ) or internal (thermal drift, noise, fluctuations, degradations, ageing . . . ) influences, that potentially disturb the writing/patterning process have to be shielded, eliminated or accounted for during the writing process in order to obtain nanostructures of high quality and good reproducibility.

Feedback loops as mentioned in U.S. Pat. No. 8,261,662 are used to control system writing parameters of the writing process, e.g. control of writing current through measurements of said current.

Scanning Probe Lithography techniques use sharp tips/probes to create nanostructures. This can be done, for example, by mechanical interactions (nano-shaving or nano-scratching as e.g. described by Yan et al., *Small*, 6(6):724-728, (2010)), with electrical fields between the tip and the sample (local anodic oxidation, see e.g. Chen et al., *Optics letters*, 30(6):652-654, (2005), field-induced deposition, see e.g. Rolandi et al. *Angewandte Chemie International Edition*, 46(39):7477-7480, (2007), field emission of electrons), light enhancement at the tip (near-field lithography, see e.g. Srituravanich et al., *Nature Nanotechnology*, 3.12 733-737, (2008)), deposition of material from the tip (dip pen lithography, see e.g. Radha et al., *ACS nano*, 7.3:2602-2609, (2013)) or local heating of the tip (thermochemical, thermal desorption lithography, see e.g. Pires et al., *Science*, 328, 732, (2010)). Usually, scanning probe lithography methods scan the surface line by line and write the nanostructures pixel by pixel along the lines.

The specification incorporates by reference the disclosure PCT/EP2014/069667.

The present invention is, of course, in no way restricted to the specific disclosure of the specification and drawings, but also encompasses any modifications within the scope of the appended claims.

In many cases, the same tip that creates the nanostructures can be used to image/read (like an Atomic Force Microscope (AFM) or a Scanning Tunneling Microscope (STM)) the nanostructures also in a line by line and pixel by pixel manner. The information/property to image/read the surface with the nanostructures is most of the time topography, but can also be e.g. friction, thermal conductivity, electrical conductivity, electrostatic potential, magnetic moment, adhesion, elastic modulus or further surface properties that can be measured by standard scanning probes microscopy techniques.

US201126882A1 is an example how external parameters (in this case leveling of the substrate) need to be measured and adjusted prior to the patterning of nanostructures.

In contrast to prior art US201126882A1, the present invention starts with the patterning process and takes the information from deviations of the target nanostructure to adjust the external parameters. This closed-loop lithography concept could potentially be applied also to solve the problem described in patent US201126882A1, which is the leveling of multiple cantilevers, in a more elegant and faster way.

U.S. Pat. No. 7,060,977B1 describes a typical calibration process that is used for many scanning probe nanolithography processes. First a "nanoscale test pattern" is fabricated. The test pattern is measured afterwards by some other means to deduct the relevant calibration parameters for the real patterning. The method allows doing the calibration and the actual application "on the same day".

The present invention does the measurement of the nanostructures continuously and during the lithography process for each line and hence within typically 10 ms to 100 ms.

U.S. Pat. No. 5,825,670A describes a method how the information from imaging of a calibration sample using scanning probe microscope can be used to reduce errors due to non-linearity in the scanner motion. It is mentioned that this calibration can also be used to better control the positioning for scanning probe lithography, where a precise positioning is even more important than for imaging.

The present invention images during the lithography process. The information of each imaged line can also be used to detect deviations from the xy position, e.g. through thermal drift, and correct for them.

Scanning probe microscopy has been combined with scribing methods like in U.S. Pat. No. 5,327,625A. Here, a scribing tool indents nanostructures into a surface and a separate scanning probe microscope is used to measure the indentations.

In the present invention the same probe is used for writing and imaging.

In Scanning Tunneling Microscopy (STM) the imaging speed depends a lot on the feed-back loop of the imaging process. Previous imaged lines can be used to predict the topography of the next imaged line and can hence help to make the feed-back loop faster, as is described in U.S. Pat. No. 4,889,988 A.

The present invention uses the fact that for each line the imaging information meaning the property of the nanostructure, like the topography in thermal scanning probe lithography, is already roughly known before the actual imaging process because the target property of the nanostructure of the writing process is known at the respective line. Hence, the imaging parameters can be optimized for speed and nondestructive imaging. This can mean for example in the case of topography that the z-positioning moves according to the target writing topography so that the probe is still in contact to measure the actual topography but without strong potentially destructive forces because the cantilever exerts a weaker force on the surface.

SUMMARY OF THE INVENTION

According to prior art procedures, such imaging/reading of the written nanostructures is done after complete writing of the nanostructures. Hence, if the writing parameters (force, electric current, contact time, temperature, . . . ) are adjusted during the writing process, this is done in a feed-back loop with a measurement of the writing parameter.

It is therefore an object of the invention to provide an improved nanolithography writing method and device.

The presented invention provides—inter alia—an improved control of the writing process and especially a way to monitor the surface and the written nanostructures during the write process and use this information to improve the write process on the fly. The method according to the invention therefore provides for a closed-loop feedback. In short, the invention provides an alternative: scanning probe closed-loop nanolithography and in-situ inspection system and method.

A scanning probe nanolithography system according to the invention comprises a probe to create nanostructures line by line through writing said nanostructures pixel by pixel along lines on a sample. It has a position system, preferably a XYZ position system, adapted to provide a positioning of the probe at a sequence of predetermined positions to the sample and its surface towards the probe and a control unit adapted to control the position system for positioning the probe for a pixel-wise writing of said lines through a writing unit. A write/actuation mechanism is used for the creation of the nanostructures. A sensor unit is adapted to detect a predetermined property of the written nanostructure and is connected to the control unit to adapt the control signals to be provided to the writing unit for writing the following line based on the measured signals of the predetermined property. Following is to be understood as the next line in time, not necessarily the adjacent line.

A tip scans over the surface of a sample. The tip is used to write/create/pattern a structure onto/into a sample and to read/image the structure and the surface of the sample as well and optional also monitor/read the distance of the tip to the surface of the sample. The information of the read process is used as feedback for the write process, e.g. for the next line. Thereby, the write process is directly controlled and stabilized with a higher frequency than uncontrolled alterations of external or internal influencing parameters can usually affect the patterning process. This method results in reliable and uniform patterning across the whole write field and less necessary calibrations prior to the writing. Also, it enables to display the written nanostructure on the computer screen already during the write process. The scan movement is done line by line (X=line direction), typically with the write process in one direction and the read process on the return. Reading the same line as the previously written line may not provide sufficient or correct information about the write process, because of the reading process itself (smaller size of the read pixel than write pixel) and the potential influence of the following write lines (finite write pixel size) on the structure. Therefore, the read line that follows the write line is preferably not done at the same line position Y, but at or between positions of earlier write lines. Hence, the scan motion in Y may go forward and backwards, depending on if the next line is a write or a read line.

In other words, the control unit is adapted to control a XY portion of the position system to position the read line that follows the write line in a constant distance in parallel at or between positions of earlier write lines. The distance can be zero, then the previous written line is re-written; or the distance can be a multiple of the distance between write lines; then there are further previously written lines between the line just being read and the "next" line to be written.

The control unit can be adapted to use the signal from the sensor unit to determine the distance between the tip and the sample surface and to use the acquired data from the sensor unit to adapt the control signals to be provided to the positioning system and consequently control the distance at all positions XY of the raster scanned area by adjusting the Z position motion.

The information of the programmed property and hence expected property of the written nanostructure can be used to adjust the Z position motion the tip to be positioned at an optimized height for reading the said written nanostructure.

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Figure 1:
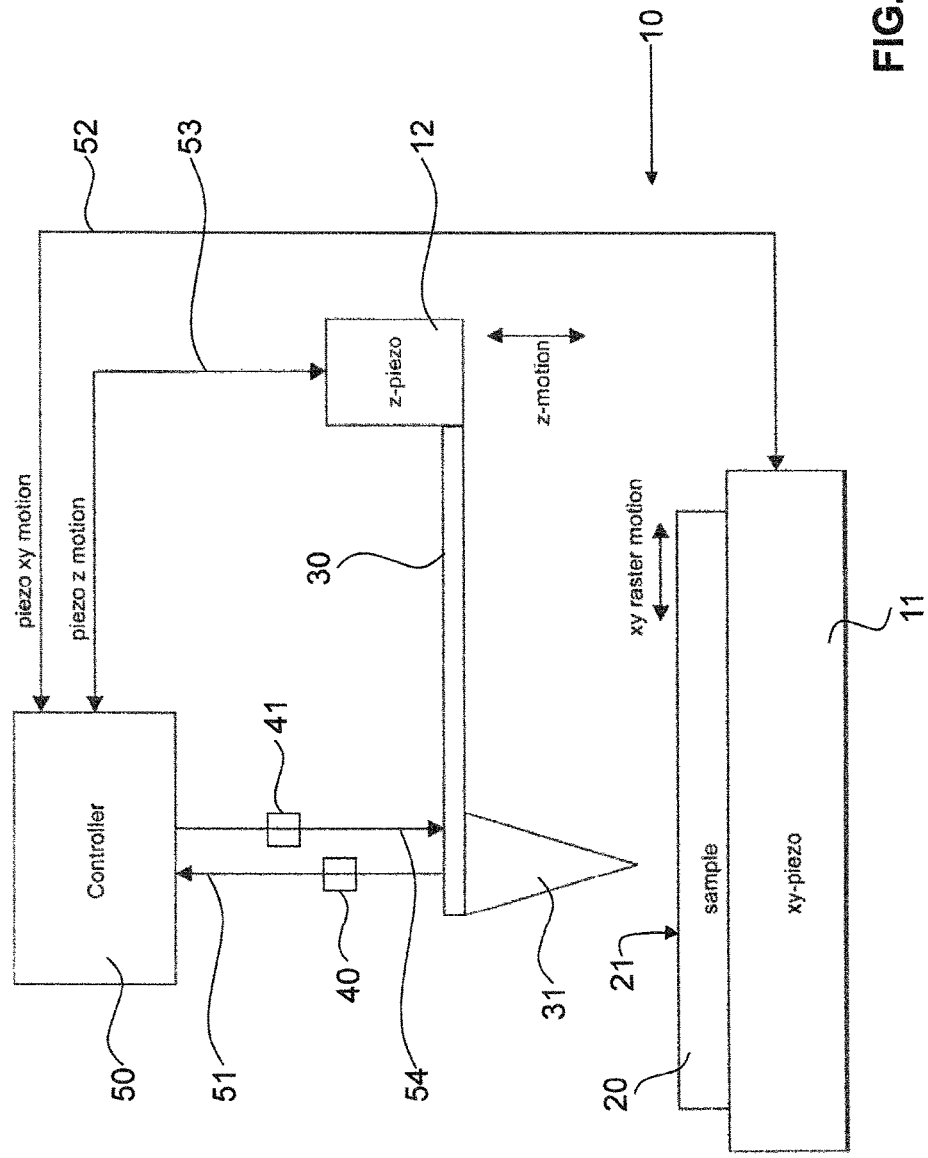
FIG. 1 shows a schematical representation of a scanning probe setup according to an embodiment of the invention.

FIG. 1 shows a schematical representation of a scanning probe setup according to an embodiment of the invention. Such a setup comprises the scanning probe lithography system and incorporates in the electronic parts control elements of the system showing a method according to the invention.

The scanning probe lithography system comprises a positioning system 10 for positioning a writing element (tip 31) in the plane over the sample 20. Here the positioning system 10 is a XYZ position system 10. Such a XYZ position system 10 can comprise e.g. piezo stages or magnetic voice-coil stages. These are shown as a xy-piezo 2D displacement unit 11 and a z-piezo displacement unit 12. The z-piezo displacement unit 12 is positioned in a direct relationship with the xy-piezo table 11 for a sample 20 where the nanostructure is produced. There is provided a tip 31 e.g. on a cantilever 30. The cantilever 30 is connected with the piezo displacement unit 12 to be displaced over the surface 21.

It is noted that the z piezo displacement is not necessarily done to write the structure. In the method according to an embodiment of the invention the displacement for the writing is done via an electrostatic actuation mechanism. The Z piezo is used to level the tip to the right position.

The cantilever 30 further comprises a write/actuation mechanism 41 to write a nanostructure with the tip 31 on or into the surface. The creation of the nanostructure originates from interactions between the tip 31 and the sample surface 21 that locally modify the sample surface 21. Such modifications can originate from mechanical scratching or grinding, dip pen deposition of various inks from the tip to the sample, heat flow from the tip to the sample, electrical current between tip and the sample, an electric field that creates a liquid meniscus between the tip and the sample, an electric field that changes and deposits molecules in a liquid or gas between the tip and the sample, emission of electrons from the tip to the sample, local flip of the magnetic moment of the sample by a magnetic tip, enhanced light interaction through near field effects of the tip or any other tip induced local modification of the sample surface. The interactions and hence the modifications are turned on by applying a capacitive force, switching on a heating current, switching on field emission of electrons, switching on a laser that is focused on the tip, displacement of the z-piezo, a bimorph bending or switching on an electric field between the tip and the sample. Depending on the write/actuation mechanism 41, parameters like temperature, duration of the interaction time, electrical current, electrical potential, displacement of the tip or light/laser intensity can be controlled and varied and hence influence the resulting write pixel in size, shape and/or degree of modification.

A sensor unit 40 is provided and adapted to detect read/image a specific property/signal of the written nanostructure using the tip 31. The property in relationship with the written nanostructure can be detected by any suitable kind of scanning probe microscopy technique for example based on the laser deflection or interferometry of the cantilever 30 or comprise a thermal sensor or piezoresistive sensor within the cantilever 30. The specific property/signal can be a physical property based on friction, thermal conductivity, electrical conductivity, electrostatic potential, magnetic moment, adhesion, elastic modulus or topography or other properties typically measured using scanning probe microscopy techniques.

Furthermore a controller unit 50, usually a computer working as a real-time system, is provided.

The XYZ positioning system 10 moves the sample 20 and/or the tip 31. The controller 50 commands the movement in XY 52 and the movement in Z 53 of the XYZ positioning system 10 and hence controls the position of the tip 31 relative to the sample surface 21. The XYZ positioning system 10 comprises positioning sensors (not shown) which send the coordinates of the position in XY 52 and the position in Z 53 to the controller unit 50. The height signal is the exemplary read signal, it is not necessarily the piezo signal in other embodiments. The sensor unit 40 sends the measured specific property/signal from the interaction of the tip 31 with the sample surface 21 via an information path 51 to the controller unit 50.

The controller unit 50 sends continuously commands for the writing process to the positioning unit 10 with control in XY 52 and control in Z 53 and commands via an information path 54 to the write/actuation mechanism 41 and hence the writing tip 31 (which is done according to usual and known procedures in the art) and receives continuously and subsequently the position of the XYZ system 10 and the one or more signals of the sensor unit 40 relating to the reading process.

Such a scanning probe system setup is provided to be used to monitor the writing process in various ways within different embodiments which are all considered encompassed by the principle of the invention.

One way to monitor the writing process is to measure/read after one or more written lines, i.e. after having written a predetermined number of pixels of one or more writing lines. Switching between writing and reading for each line or between several lines provides information about the writing process that can be used as feedback signal for the writing parameters. Simple switching between the lines (trace and retrace) may not be sufficient to measure the final write result because the extension of the read pixels 66 is usually not of the same size as the write pixels 62 and write pixels of the next line may influence the final nanostructure if the distance in Y between write lines is smaller than the extension of the write pixels 62.

Figure 2:
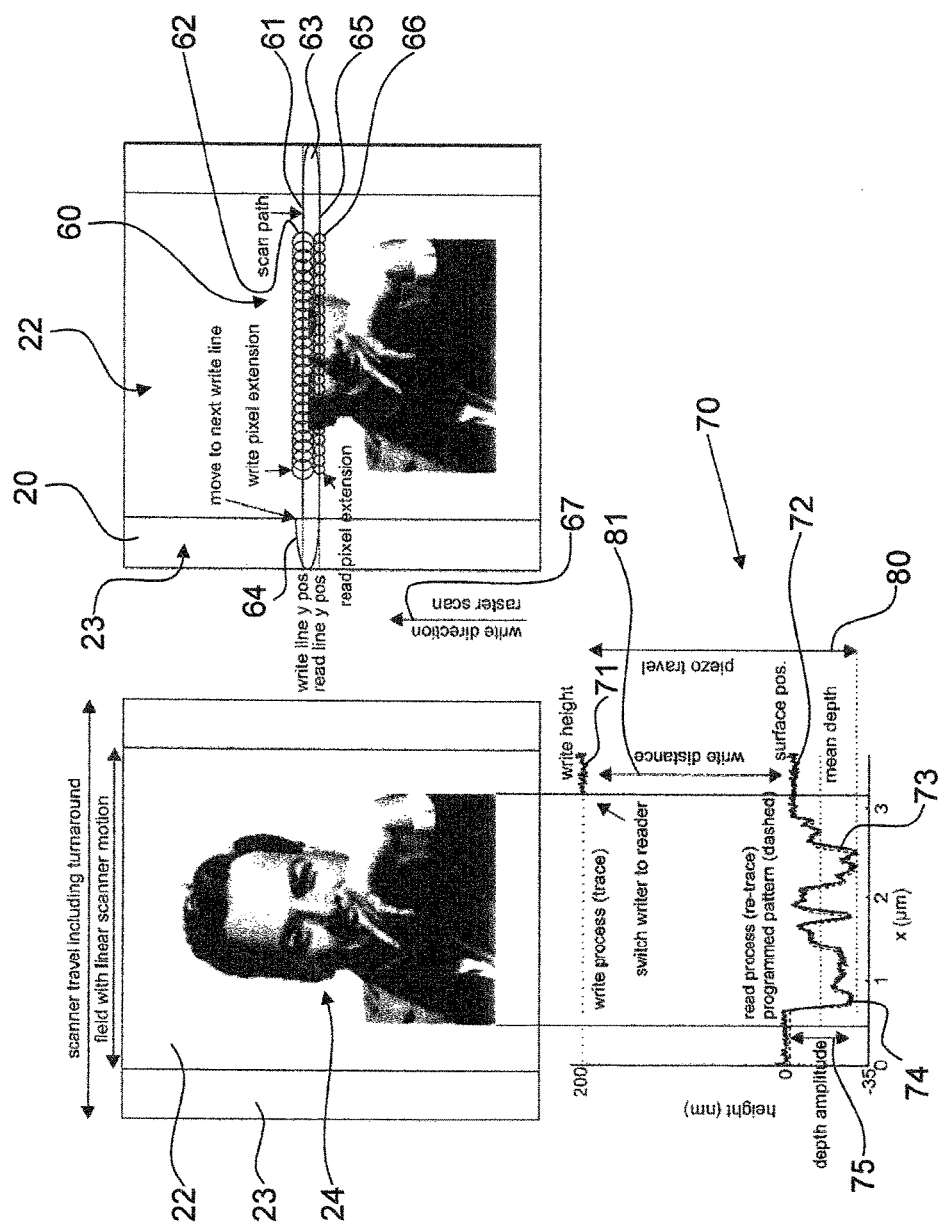
FIG. 2 shows a closed-loop lithography process through visualization of the write and read process according to an embodiment of the invention.

FIG. 2 shows, inter alia, on the right side a scheme for a scan path 60 to overcome the previously mentioned limitations and really use only information of final written lines (written pixel extensions 62) as input for the ongoing writing process. The scan path 60 that goes both forward 61 and backwards 65 in the Y direction and not just forward as done in all usual scanning probe technologies. In a simpler embodiment, the forward write path 61 and the backward read pass comprise a simple switching between read and write lines as a basic approach for a feedback implementation. In another embodiment the direction of the write path 61 and the read path 65 are in the same direction, wherein the next write path after a read path 65 can comprise a turn in the side areas 23 as will be explained below.

Thermal desorption nanolithography is an exemplary scanning probe nanolithography technique, which is suitable and has been demonstrated to work for the presented closed-loop nanolithography scheme. This technique uses a heatable tip 31 and resist materials like polyphthalaldehyde (PPA) that are responsive to heat. The resist evaporates at the locations where it comes into contact with the hot tip. The write/actuation mechanism (in this case an electrostatic force that pulls a heated tip into contact with the sample for a certain time) determines how deep the tip penetrates the resist and hence determines the depth of the pattern. The force is varied e.g. according to the gray-level of a bitmap. Thereby, the bitmap can be converted into a relief in the resist where the depth at each position corresponds to the gray-level of the bitmap. However, effects like drift in Z direction, non-parallelism between the scan plane and the sample plane or physical and chemical changes within the tip, the cantilever 30 and the sample 20 influence the patterning force (as exerted through control signals 54) and the distance between tip 31 and sample 21 and hence influence the depth during the write process. A full control over all these effects during the write process of fields of typical sizes between 0.1 $\mu m^2$ and 100,000 $\mu m^2$ is hardly possible. Therefore, in this example the force and Z piezo position are adjusted during the write process according to the measured topography of the previous lines.

FIG. 2 further displays the closed-loop lithography process for the example of thermal desorption nanolithography through visualization of the write and read process according to an embodiment of the invention. A grayscale bitmap of physicist Richard Feynman was written into PPA as sample 20 using a heatable tip 31. Piezo motors were used to scan the tip 31 in X and Y over the surface 21 in a raster scan manner. The pattern image 24 was written within a central area 22 of the piezo scanner movement, where the movement is linear, meaning the scan speed of typically between 0.1 and 10 mm/s in X was constant. In the surrounding turnaround zone 23 the scan movement in X turns around. The time during which the tip 31 is in this region (typically 1 ms to 100 ms) was not used for patterning but for positioning in Y (go to next line) and for processing of the feedback data. The turnaround zone 23 is part of the example and not an inevitable part of the invention as the data processing and the positioning in Y can also be done within the central area 22, however, with an possible loss in positioning accuracy.

The writing with the heated tip 31 was done in trace (to the right, positive X) direction along line 61 and creating write pixel extensions 62. During the turnaround 63 in zone 23, the tip 31 was cooled down and moved backwards (negative Y direction). On the retrace (to the left, negative X) direction along line 65 the cold tip 31 was used to measure the topography of the sample surface 21 via an integrated thermal sensor as sensor unit 40. This is shown in the exemplary height diagram (cross section at the position of the eyes of Richard Feynman) on the lower left part of FIG. 2, wherein the height 0 is the surface position and the double arrow 75 shows the depth amplitude (in this case around 30 nm) of the topography towards the lower dotted line, wherein the intermediate line of the two dotted parallel lines is related to the mean depth (in this case around 12 nm). Within the writing step at tip height 71 the sample 20 was structured using the heated tip 31 and the write/actuation mechanism 41 (in this case the patterning force) to write the programmed depth of the pattern. Upon the way back with the lowered cold tip 31, said tip followed the solid line 73 as measured/read depth, predetermined by the written structure and the sensor unit (in this case the integrated thermal sensor) sent the topography signal to the control unit (50).

The measured topography was compared to the programmed/target depth at this line (Y position). Deviations from the target were detected. This can be done for each X position (corresponding to an applied patterning force) or global deviations like the deviation of the mean depth (to adjust the mean writing force) and/or the depth amplitude 75 (to adjust the force range) can be calculated. In the next turnaround zone, the tip is moved forward (positive Y direction) to the next write line. Which write line 61 is the next write line can depend on the measured deviation (e.g. a line can be repeated). For this next write line 61 the patterning forces were adjusted according to the measured deviations. In this example, if the depth was too shallow, the patterning force was increased accordingly to meet the target depth. As a consequence, the patterning depth 73 matches the target depth 74 with exceptional precision for the whole nanostructure 24.

Both the write and the read pixels 62 and 66 have a finite extension (typically 0.1 nm to 100 nm depending on the tip size and the kind of interaction with the sample surface 21). It is important that the reading occurs in the area where the writing is "finished", meaning that it is out of reach of a not yet written line which could still influence the nanostructure at this Y position. Therefore the backwards step before reading should be large enough, so that it is guaranteed that the extensions of the subsequent write line do not intersect with the extension of this read line. The reading line 66 does not necessarily read (in this example measure the depth) of the previously written line 61, but read lines that have been written one or more steps before. If the specific just written line should be monitored, then the backwards step before reading should be smaller than half the write pixel extension 62 plus half the read pixel extension 66 as shown in the embodiment of FIG. 2. Here each read pixel 66 is smaller than the neighboring write pixel 62. However, the parallel distance between write line 61 and read line 65 is small enough that such circles intersect.

The sensor 40 can also be used to gain additional information for feedback control of the writing process besides reading the written pattern and compare it with the target pattern as described above. If the sensor 40 is capable of measuring the distance between the tip 31 and the sample surface 21, like it is possible with a thermal height sensor, then this information about the distance can be used as a further feedback input for the writing process. For this feedback, a frame around the image pattern 24 was left in the example of FIG. 2 within the field 22 of linear scanner motion.

This reading frame is used to determine the distance 81 between the surface 72 and the tip 31 at write height 71. In the example, the tip 31 was cooled down and the read sensor 40 switched on inside that frame. In the frame of a read line 65 the tip was in contact with surface and hence the surface position 72 was measured. In a write line 61, the tip was out of contact at a corresponding write height 71 and hence the corresponding write distance 81 was determined. This can be done on the left and on the right side of a write field 24 and for each line, meaning for all Y positions. As a consequence, if for example the sample plane is not perfectly parallel to the scan plane (which is almost always the case) or if a drift in Z occurs during the process, this is detected through the measured deviations of the distance 81 in X or Y direction. Such deviations can hence be compensated for to improve the control over the write process. In the example, the deviations have been corrected using the Z piezo stage 12, so that the write distance 81 maintained constant during the whole write process and hence enabling a more accurate control of the patterning force over the whole write field 24.

The target depth and the measured depth can further be used as feed-forward input to determine the ideal reading position in Z for each line. If the reading Z position of the tip 31 is chosen is not deep enough the tip 31 might be getting out of contact with the sample 21 and hence not read the surface topography anymore. On the other hand, if the reading Z position of the tip 31 is chosen too deep then the tip 31 and the sample 21 can be harmed due to increased pressure between the tip 31 and sample 21 for shallow structures. In the example, the Z piezo was used during the read process to move the tip 31 to the programmed depth amplitude 75, which is the expected maximum depth. This prevents the tip 31 from losing contact of the surface and hence insufficient reading and minimizes the degradation of the tip 31 and the sample 21 through the reading process.

FIG. 2 shows on the left a written and imaged nano-relief of Richard Feynman. The square 22 around the image 24 illustrates the scan field of the XY positioning system 10 with and without the turnaround zone 23. The graph 70 underneath the image displays a cross-section through one exemplary line of the topography image. The dashed line 74 is the programmed depth of the pattern and the solid line 73 measured/read depths. Feedback parameters like mean depth or depth amplitude are illustrated. The Z movement 12 between write and read (piezo travel 80) is also illustrated in the image. On the right portion the scan path is illustrated as a solid line with portions 61, 63, 65 and finally 64 in the sense of motion. The circles 62 and 66 illustrate the extensions of the write and read pixels (the write and read interaction volume); the size of the pixel at such can be quite different to the values mentioned in connection with the embodiment in FIG. 2. It is noted that it is also possible but not preferred that the reading of the written lines is performed in the same direction as the writing, then after cooling down tip 31, it is returned at the starting point of the line and the switch to the next reading line either occurs at the end of the reading or tip 31 is again displaced at the beginning of the written and then read line.

The example in FIG. 2 uses thermally induced evaporation of resist material by a heated tip and an electrostatic force as the write/actuation mechanism 41 and a thermal sensor element integrated in the cantilever 30 as the sensor unit 40 to read with the same tip the topography as the specific property of the written nanostructure.

Many combinations of different write and read processes using the same tip for writing and reading would be suitable for the presented invention: For example, Szoszkiewicz et al., (Nano Letters, 7(4):1064-1069, 2007) wrote hydrophilic nanostructures onto a hydrophobic polymer by local chemical modification using a heated tip and imaged the written nanostructures after the write process by measuring the friction on the sample surface using Lateral Force Microscopy. Nanostructures written by local anodic oxidation, as for example done by Martinez et al. (Nanotechnology, 21(24):245301, 2010), can be imaged by reading the topography or the electric potential using Kelvin Probe Microscopy. Dip Pen Lithography is a wide spread nanolithography technique and usually writes nanostructures by bringing a tip that is covered with an ink into contact with the sample surface and thereby deposit the ink onto the sample surface. Nelson et al. (*Applied physics letters*, 88:033104, 2006) showed that they could write metal inks by thermal dip pen lithography and imaged the written structures with the same tip after writing of the nanostructure. Therefore, using the same tip for reading of the written ink nanostructures is possible, because it can be avoided that ink is deposited again during the reading process.

LIST OF REFERENCE SIGNS

| | |
|---|---|
| 10 | XYZ position system |
| 11 | xy displacement unit |
| 12 | z displacement unit |
| 20 | sample |
| 21 | surface to be nanostructured |
| 22 | central area |
| 23 | border area/turnaround zone |
| 24 | image of pattern |
| 30 | cantilever |
| 31 | tip |
| 40 | sensor unit |
| 41 | write/actuation mechanism |
| 50 | controller unit |
| 51 | read signal |
| 52 | control of xy motion |
| 53 | control of z motion |
| 54 | write signal |
| 60 | scan path |
| 61 | write path |
| 62 | write pixel extension |
| 63 | turn around portion |
| 64 | move to next line portion |
| 65 | read path |
| 66 | read pixel extension |
| 67 | write direction |
| 71 | write height |
| 72 | read height |
| 73 | measured depth (solid line) |
| 74 | programmed depth (dashed line) |
| 75 | depth amplitude |
| 80 | z piezo travel |
| 81 | write distance |

The invention claimed is:

1. A scanning probe nanolithography system for writing nanostructures along write lines on a sample, comprising:
   a probe to create the nanostructures line by line through writing said nanostructures pixel by pixel along lines on a sample;
   an XYZ positioning system, with an XY portion adapted to provide a positioning of the probe at a sequence of predetermined positions along write lines to the sample and with a Z portion to position the probe with its surface towards the sample;
   a writing unit comprising a write/actuation mechanism of the probe for the pixel-wise creation of the nanostructures along write lines;
   a control unit adapted to control the XY portion of the XYZ positioning system for positioning a read line that follows a write line in a constant distance in parallel at or between positions of earlier write lines; and
   a sensor unit adapted to detect a predetermined property of the written nanostructure on the sample pixel by pixel of the read line that was read,
   wherein the sensor unit is connected to the control unit to adjust control signals, wherein the control signals are provided to the writing unit for writing a next write line, wherein the control signals are based on the measured signals of the predetermined property of the read line, wherein the predetermined property is selected from the group of physical properties consisting of friction, thermal conductivity, electrical conductivity, electrostatic potential, magnetic moment, adhesion, elastic modulus, and topography.

2. The scanning probe nanolithography system according to claim 1, wherein the constant distance is zero or a multiple of the distance between write lines.

3. The scanning probe nanolithography system according to claim 1, wherein the probe and the positioning system are connected via a cantilever and the predetermined property is measured by measuring the deflection of the cantilever using laser deflection or interferometry.

4. The scanning probe nanolithography system according to claim 3, wherein the sensor unit comprises a thermal sensor or a piezoresistive sensor integrated into the cantilever.

5. The scanning probe nanolithography system according to claim 1, wherein the sensor unit comprises the probe itself.

6. The scanning probe nanolithography system according to claim 1, wherein the positioning system comprises piezo stages or magnetic voice-coil stages.

7. The scanning probe nanolithography system according to claim 1, wherein the XY portion of the XYZ positioning system is a xy-piezo 2D displacement unit and the Z portion of the XYZ positioning system is a z-piezo displacement unit.

8. The scanning probe nanolithography system according to claim 1, wherein the control unit is adapted to restrict writing and reading of lines to a central area of the sample.

9. The scanning probe nanolithography system according to claim 1, wherein the write/actuation mechanism to create the nanostructure uses a heated tip to deposit material from the tip to the sample or to bring the tip into mechanical contact with the sample.

10. The scanning probe nanolithography system according to claim 3, wherein the write/actuation mechanism to create the nanostructure uses an electric field between the cantilever and the sample.

11. The scanning probe nanolithography system according to claim 1, wherein the control unit is adapted to use a signal from the sensor unit to determine the distance between the tip and the sample surface and to use the acquired data from the sensor unit to adapt the control signals to be provided to the XYZ positioning system and consequently control the distance at all positions XY by adjusting the Z position motion.

12. The scanning probe nanolithography system according to claim 1, wherein the information of the measured property of the written nanostructure is used to adjust the Z positioning motion for the tip to be positioned at a predetermined height for reading the said written nanostructure.

13. A scanning probe nanolithography writing method using a scanning probe nanolithography system for writing nanostructures along lines on a sample, comprising a probe to create the nanostructures line by line through writing said nanostructures pixel by pixel along lines on a sample; a positioning system, adapted to provide a positioning of the probe at a sequence of predetermined positions to the sample and its surface towards the probe; a writing unit comprising a write/actuation mechanism for the pixel-wise creation of the nanostructures in write lines; a control unit adapted to control the positioning system for positioning the probe for the pixel-wise writing of said write lines through the writing unit, a sensor unit adapted to detect a predetermined property of the written nanostructure pixel by pixel in a read line, wherein the sensor unit is connected to the control unit to adjust the control signals, wherein the control signals are based on the measured signals of the predetermined property and are provided to the writing unit for writing a next line, comprising the steps of:

- displacing the probe along a write line to create nanostructures pixel by pixel along the write line on the sample through the writing unit;
- repositioning the probe along a reading line parallel to the write line through the positioning system after each write line;
- measuring a predetermined property of the written nanostructure of a read line through the sensor unit; and
- calculating control signals to be provided to the writing unit for writing the next line through the control unit by using the acquired data signals from the sensor unit.

14. The scanning probe nanolithography writing method according to claim 13, wherein the control unit controls a XY portion of the positioning system to position the read line that follows the write line in a constant distance in parallel at or between positions of earlier write lines.

15. The scanning probe nanolithography writing method according to claim 14, wherein the constant distance is zero or a multiple of the distance between write lines.

16. The scanning probe nanolithography system according to claim 1, wherein the write/actuation mechanism to create the nanostructure uses an electric field between the tip and the sample to deposit material from the tip to the sample or to bring the tip into mechanical contact with the sample.

* * * * *